US011991866B2

(12) United States Patent
Salim et al.

(10) Patent No.: US 11,991,866 B2
(45) Date of Patent: May 21, 2024

(54) ADAPTIVE CASCADE COOLING METHOD FOR DATACENTERS

(71) Applicant: HEWLETT PACKARD ENTERPRISE DEVELOPMENT LP, Spring, TX (US)

(72) Inventors: Munther Salim, Chicago, IL (US); Michael Dedkov, Dubai (AE)

(73) Assignee: Hewlett Packard Enterprise Development LP, Spring, TX (US)

( * ) Notice: Subject to any disclaimer, the term of this patent is extended or adjusted under 35 U.S.C. 154(b) by 40 days.

(21) Appl. No.: 18/046,225

(22) Filed: Oct. 13, 2022

(65) Prior Publication Data

US 2024/0130089 A1    Apr. 18, 2024

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ......... *H05K 7/20763* (2013.01); *H05K 7/202* (2013.01); *H05K 7/20209* (2013.01); *H05K 7/20272* (2013.01); *H05K 7/2059* (2013.01); *H05K 7/20609* (2013.01)

(58) Field of Classification Search
CPC ............... H05K 7/20763; H05K 7/202; H05K 7/20209; H05K 7/20272; H05K 7/2059; H05K 7/20609; H05K 7/2079
See application file for complete search history.

(56) References Cited

U.S. PATENT DOCUMENTS

| | | | | |
|---|---|---|---|---|
| 6,819,563 B1* | 11/2004 | Chu | ................... | H05K 7/20736 165/104.33 |
| 7,757,506 B2* | 7/2010 | Ellsworth, Jr. | ..... | H05K 7/20772 62/332 |
| 7,765,827 B2* | 8/2010 | Schlom | ................. | F24F 5/0035 62/309 |
| 8,596,067 B2* | 12/2013 | Conard | ................... | F01K 13/00 60/671 |
| 8,689,861 B2 | 4/2014 | Campbell et al. | | |
| 8,925,333 B2 | 1/2015 | Campbell et al. | | |
| 9,313,931 B2* | 4/2016 | Goth | ................. | H05K 7/20836 |
| 10,571,980 B2* | 2/2020 | Wang | ..................... | G06F 1/206 |

(Continued)

*Primary Examiner* — Anthony M Haughton
(74) *Attorney, Agent, or Firm* — Hewlett Packard Enterprise Patent Department

(57) ABSTRACT

Examples of hybrid cooling System for datacenters are disclosed. In an example, the hybrid cooling system includes a chiller plant to provide supply of coolant, an air-cooling unit (ACU), and a coolant distribution line. The coolant distribution line comprises a first portion, a second portion, and a third portion in series fluid communication. The ACU receives supply of the coolant from the chiller plant via the first portion. The hybrid cooling system further includes a coolant distribution unit (CDU) coupled to an electronic component in the data hall. The ACU and the CDU are in series fluid communication via the second portion of the coolant distribution line and the coolant egressing the ACU passes through the second portion to be fed back to the CDU. The hybrid cooling system includes a heat exchanger in series fluid communication with the CDU via the third portion of the coolant distribution line.

20 Claims, 4 Drawing Sheets

(56) References Cited

U.S. PATENT DOCUMENTS

| | | | | |
|---|---|---|---|---|
| 2014/0133098 A1* | 5/2014 | Campbell | ............... | F28F 9/00 |
| | | | | 165/47 |
| 2021/0368655 A1* | 11/2021 | Gao | ............... | H05K 7/20836 |
| 2022/0354022 A1* | 11/2022 | Chen | ............... | H05K 7/20354 |
| 2022/0408607 A1* | 12/2022 | Gao | ............... | H05K 7/20772 |
| 2022/0413572 A1* | 12/2022 | Heydari | ............ | H05K 7/20781 |
| 2023/0008636 A1* | 1/2023 | Heydari | ............... | F24F 11/49 |
| 2023/0371212 A1* | 11/2023 | Heydari | ............ | H05K 7/20209 |

\* cited by examiner

ADAPTIVE CASCADE COOLING METHOD FOR DATACENTERS

BACKGROUND

A datacenter may refer to a facility, a building, a container, a dedicated space within a building, or a group of buildings used to house computer systems, network systems, and storage systems. A datacenter comprises racks in which different electronic systems, such as servers, network switches, routers, gateways, memories, power supplies, and cooling systems, may be mounted. Cooling systems are used to maintain a datacenter and the electronic systems therein within a specific operating temperature range.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
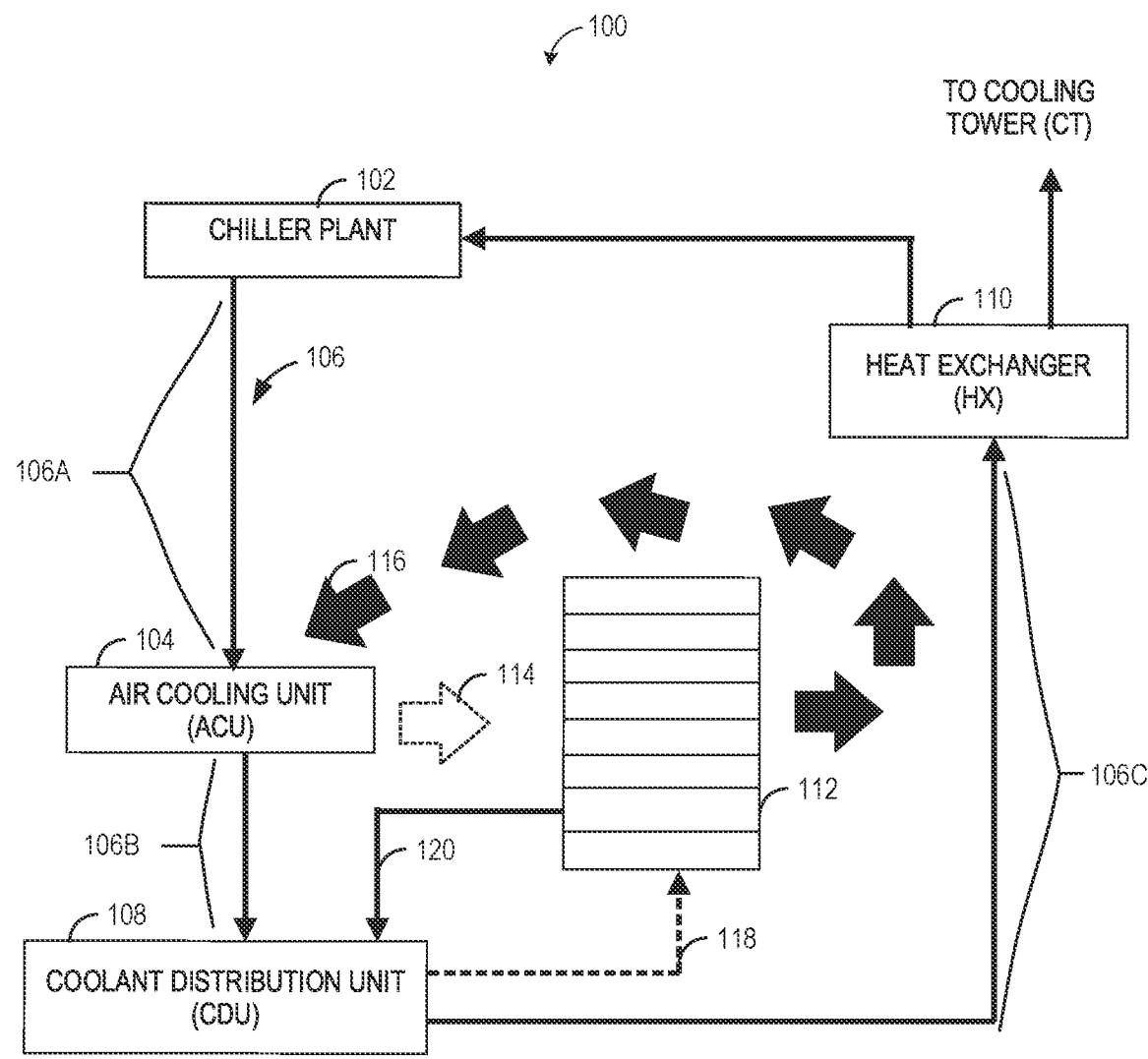
FIG. 1 illustrates a block diagram of a hybrid cooling system for a datacenter, according to an example of the present subject matter.

Different datacenters may have different cooling loads depending on different types of computing systems which may be housed in the datacenter. Cooling load refers to the rate at which heat shall be removed from the datacenter to maintain a constant temperature. Heat generated by different computing systems in the datacenter may vary based on the capabilities of these computing systems. Thus, rack power density of different racks housing these computing systems may also vary. Rack power density refers to the electrical power consumed by computer systems per rack in a datacenter. A datacenter with racks of high rack power density may generate more heat as compared to a datacenter with racks of low or medium rack power density. In an example, a rack power density of upto 8 kW may be considered as low rack power density, a rack power density of about 15 to 20 kW may be considered as medium rack power density, and a rack power density of above 20 kW may be considered as high rack power density.

As an example, a datacenter with high performance computing (HPC) servers may have racks with a high rack power density and thus have a higher cooling load compared to a datacenter with enterprise servers that may have racks with medium rack power density and a lower cooling load. An HPC server may refer to multiple compute nodes that are networked together and which uses parallel data processing thereby boosting processing speed to deliver high performance computing for solving advanced computation problems. As an example, an HPC server may have a capability to perform above one teraflop, i.e., $10^{12}$ floating point operations per second (FLOPS). An enterprise server may refer to a computer server that may have a capability to perform about 1 to 50 gigaflops, where 1 gigaflop equals $10^9$ FLOPS.

Datacenters with racks of high rack power density may not be adequately cooled using cooling systems that may be used for a datacenter with racks of low or medium rack power density. Generally, datacenters with racks of low or medium rack power density may be cooled using an air-cooling system and datacenters with racks of high rack power density may be cooled using a liquid-cooling system. This is because, liquid-cooling systems may handle a higher cooling load in comparison to air-cooling systems, and thus may be better suited to cooling racks of high rack power density.

Both liquid cooling systems and air-cooling systems may comprise server/rack-level subsystems that are deployed in individual servers/racks (which may include, for example, server fans, heatsinks, cold plates, etc.) and datacenter-level subsystems that are deployed to service multiple racks or even datacenter-wide (which may include, for example a chiller plant, pumping system, piping system, heat rejection units, etc.). The server/rack-level subsystems of the cooling systems draw heat out of the individual servers or other devices in the racks and then this heat may be transferred into the datacenter-level subsystems which may dispose of the heat, for example by transferring the heat into an exterior environment or otherwise utilizing the heat (e.g., via converting the heat into electricity or some other useful form). Liquid-cooling systems and air-cooling systems differ from one another primarily in that the liquid-cooling systems tend to utilize liquid flows inside the server/rack-level subsystems to remove heat form the devices (and thus they utilize equipment specialized to liquid cooling) whereas air cooling systems tend to utilize air in the server/rack-level subsystems to cool the devices (and thus utilize different equipment). Because the liquid-cooling systems require equipment that is specialized to liquid cooling, such as additional pipeline installations for carrying cold coolant and hot exhaust coolant and manifolds/tubings in thermal or mechanical contact with components to be cooled, liquid cooling systems, in certain circumstances, may require more capital expenditure and depending on climate and other factors may have additional installation requirements in comparison to air-cooling systems.

Further, a single datacenter may have multiple racks having different rack power densities. The rack power density of one rack may vary from that of another owing to a difference in a number of computing systems in those racks or capabilities of the computing systems in those racks. Thus, a datacenter may have some racks of high rack power density and some racks of low/medium rack power density. The average rack power density of the datacenter with some racks of high rack power density and some racks of low/medium rack power density may be referred to as a mixed rack power density. As an example, the datacenter may have some racks with HPC servers and some with enterprise servers. Thus, the racks with HPC servers may have a high rack power density, of about 40-100 kW/rack for example, and the racks with enterprise servers may have a low or medium rack power density of about 5-8 kW/rack, for example. The racks with high rack power density may need to be liquid-cooled, whereas, the racks with low/medium rack power density may be air-cooled.

Due to the need for liquid-cooling of the racks with high rack power density, a simple air-cooling system as used in datacenters with all racks of low/medium rack power density may not be capable to sufficiently cool a datacenter with mixed rack power density. Thus, one approach to cooling such a datacenter with a mixed rack power density would be to provide a liquid-cooling system with higher capacity to cool the entire datacenter, i.e., both the high-rack power density and low-rack power density racks. Since the single liquid cooling system is required to handle the entire cooling load of the datacenter, the liquid cooling system shall have a high cooling capacity. The cooling capacity of a cooling system refers to the amount of heat the cooling system can remove from the datacenter per unit of time. However, using a single liquid-cooling system with a high cooling capacity may be challenging, because, as mentioned earlier, the liquid-cooling system may be costlier and may involve additional installation requirements.

Consequently, instead of using a single liquid-cooling system of high cooling capacity, some datacenters with a mixed rack power density, may use two independent dedicated cooling systems, i.e., an air-cooling system to handle the racks of low/medium rack power density and a liquid-cooling system to handle the racks of high rack power density. Based on the number of racks having low/medium rack power density and the racks having high rack power density, the cooling capacity for each of these systems may be fixed. Since, the cooling load is distributed between the air-cooling and liquid-cooling systems, cost and complexity of installing a single liquid-cooling system with high cooling capacity may be avoided. Thus, having two independent cooling systems, i.e., an air-cooling and a liquid-cooling system may be more economical, than having a single liquid-cooling system of high cooling capacity. However, having two independent dedicated cooling systems, i.e., an air-cooling and a liquid-cooling system, may increase the piping requirements, complexity of handling different coolant loops for each cooling system, and capital cost, since each system may require its own dedicated pumping system, piping system, and heat rejection units.

In addition, cooling capacities of each of the independent dedicated cooling systems are generally fixed based on a number of racks of low/medium rack power density to be air-cooled and a number of racks of high rack power density to be liquid-cooled present at the time of installation of these systems. Accordingly the mechanical and electrical sub-systems to be installed in the datacenter facility are designed. For example, suppose the cooling system is to be designed for 10 racks of high rack power density and 20 racks of low/medium rack power density. Since the racks of high rack power density are to be liquid-cooled, the mechanical and electrical sub-systems supporting the liquid-cooling system may be designed and installed such that the liquid-cooling system has a capacity to cool the 10 racks of high rack power density. Similarly, since the racks of low/medium power density are to be air-cooled, the mechanical and electrical sub-systems supporting the air-cooling system may be designed and installed such that the air-cooling system has a capacity to cool the racks of low/medium power density. If the number of racks of high rack power density or low/medium rack power density are changed at a later stage, the air-cooling system or the liquid-cooling system may require significant alterations in the design of the mechanical and electrical sub-systems supporting them which may involve substantial time, labor, and cost to do so. Thus, having two independent cooling systems may impose a fixed air-cooling capacity and a fixed liquid-cooling capacity on the datacenter.

In a datacenter with mixed rack power density, a number of racks with high rack power density and a number of racks with low/medium rack power density may not remain the same at all times. A change in the number of racks of high rack power density or low/medium rack power density may result in a change in the demand for liquid-cooling or air-cooling in the datacenter. Consequently, a change in cooling capacities of the air-cooling system or liquid-cooling system may be necessary. For example, a datacenter may have 10 racks of high rack power density and 20 racks of medium rack power density at the time of commissioning. However, at a later point in time, suppose 5 additional racks of high rack power density are added. Since the additional racks of high rack power density may generate more heat, there may be an additional demand for liquid-cooling in the datacenter and capacity of the liquid-cooling system may be required to be increased to handle the additional demand. However, since the liquid-cooling system and the air-cooling systems were originally designed to handle the cooling load of 10 racks of high power density and 20 racks of medium power density, respectively, any change in their capacities may involve significant alterations in the design of the mechanical and electrical sub-systems supporting them. This may result in substantial time consumption, additional labor, and cost.

The present subject matter provides for a hybrid cooling system for a datacenter that combines an air-cooling unit (ACU) for air-cooling and a coolant distribution unit (CDU) for liquid-cooling in series fluid connection via a single coolant distribution line. The ACU transfers heat out of air that has been used for cooling in a server/rack-level air cooling subsystem into a flow of coolant in the coolant distribution line, from whence the heat may be transferred to other datacenter-level cooling subsystems, such as a chiller. The CDU transfers heat from liquid used for cooling in a server/rack-level liquid cooling subsystem into the coolant distribution line. Coolant egressing from the ACU is input to the CDU via a portion of the coolant distribution line. Thus, in examples disclosed herein the hybrid cooling system may include both air cooling subsystems and liquid cooling subsystems at the server/rack-level, but unlike the approach in which two fully independent air and liquid cooling systems are provided, in the hybrid cooling system the server/rack-level air cooling subsystems and server/rack-level liquid subsystems may share some components at the datacenter-level, such as the coolant distribution line. This arrangement of the hybrid cooling system may allow for a reduction in the number of pipes and their length inside the datacenter because a single coolant distribution line is used. Thus, the hybrid cooling system may be simpler to install and more cost effective to implement in a datacenter as compared to independent dedicated air-cooling and liquid-cooling systems.

In addition, the hybrid cooling system may control the flow of coolant through the ACU and CDU by employing bypass lines and control valves thereby allowing adjustments in the capacities of the liquid-cooling system and the air-cooling system as per changes in the cooling load. This may allow for dynamic changes of liquid-cooling to air-cooling capacities with changes in number of racks of high rack power density or number of rack of low/medium rack power density in a datacenter. Thus, the hybrid cooling system may provide flexibility of air and liquid cooling capacity adjustment within the data center without substantial changes to mechanical and electrical sub-systems in the datacenter.

Further, in the hybrid cooling system, the coolant is pumped through a single line, i.e., the coolant distribution line which supplies the coolant to the ACU, CDU, and other components in series fluid connection. Unlike independent liquid-cooling and air-cooling systems, the coolant in the hybrid cooling system is not pumped through dedicated piping systems in parallel for each of the liquid-cooling systems and air-cooling systems, and therefore, less power may be consumed by a pump pumping the coolant in the hybrid cooling system as compared to power consumed by pumps in independent liquid-cooling and air-cooling systems. Thus, the hybrid cooling system may be energy efficient as compared to independent air-cooling and liquid-cooling systems.

According to an example of the present subject matter, the hybrid cooling system comprises a chiller plant to provide supply of coolant, an ACU configured to be disposed in a data hall of a datacenter to be cooled, a coolant distribution line, a CDU, and a heat exchanger. A coolant may refer to a fluid that is used to remove heat from an object. As an example, a coolant may refer to a liquid flowed through air-to-liquid or liquid-to-liquid heat exchangers to allow for transfer of heat from air or electronic components in the datacenter to the liquid. In an example, the coolant may comprise at least one of brine, a fluorocarbon liquid, a liquid metal, or other similar refrigerants used in cooling loops. The coolant distribution line comprises a first portion, a second portion, and a third portion, wherein the first, second, and third portions are in series fluid communication and the ACU receives supply of the coolant from the chiller plant via the first portion. The CDU is configured to couple to an electronic component in the data hall, where the ACU and the CDU are in series fluid communication via the second portion of the coolant distribution line and the coolant egressing the ACU passes through the second portion to be fed back to the CDU. The heat exchanger is in series fluid communication with the CDU via the third portion of the coolant distribution line, where the coolant egressing the CDU passes through the third portion to the heat exchanger. As may be understood, a single coolant distribution line is used to circulate the coolant from the chiller plant to the ACU to the CDU and finally to the heat exchanger via series fluid connections. In the hybrid cooling system, use of the single coolant distribution line, a common chiller or cooling plant, and common heat exchanger for the ACU and the CDU may reduce the use of dedicated chiller plants, pumping systems, piping systems, and heat rejection units for each of an air-cooled system and a liquid-cooled system if two such independent systems are used in a datacenter. Thus, the hybrid cooling system may provide ease of implementation and may be cost effective as compared to having independent air and liquid cooling systems in the datacenter.

The above systems and methods are further described with reference to FIG. 1 to FIG. 4. It should be noted that the description and figures merely illustrate the principles of the present subject matter along with examples described herein and, should not be construed as a limitation to the present subject matter. It is thus understood that various arrangements may be devised that, although not explicitly described or shown herein, embody the principles of the present subject matter. Moreover, all statements herein reciting principles, aspects, and embodiments of the present subject matter, as well as specific examples thereof, are intended to encompass equivalents thereof.

FIG. 1 illustrates a block diagram of a hybrid cooling system 100 for a datacenter according to an example of the present subject matter. The hybrid cooling system 100 comprises a chiller plant 102, an air-cooling unit (ACU) 104, a coolant distribution line 106, a coolant distribution unit (CDU) 108, and a heat exchanger 110. It should be understood that FIG. 1 is not intended to illustrate specific shapes, dimensions, or other structural details accurately or to scale, and that implementations of the hybrid cooling system 100 may have different numbers and arrangements of the illustrated components and may also include other parts that are not illustrated.

As shown in FIG. 1, the hybrid cooling system 100 may be used as a heating, ventilation and air conditioning (HVAC) system to cool a datacenter housing a rack 112 on which different electronic components may be mounted. In an example, the hybrid cooling system 100 may be used to cool an electronic component housed on the rack through direct liquid cooling (DLC). DLC refers to the use of a liquid coolant (such as dielectric fluids) to dissipate heat from electronic components mounted on a rack, where the liquid coolant may be delivered directly to a liquid-cooled cold plate disposed in mechanical/thermal contact with the electronic components to be cooled. In other examples, the hybrid cooling system 100 may be used in close-coupled cooling, (i.e., a rack with rear door heat exchanger) and/or near coupled cooling (also called in-row cooling). The hybrid cooling system 100 applied in close-coupled cooling may be able to cool racks with rack power density of about 50-60 kW per rack. The hybrid cooling system 100 applied in near coupled cooling may be able to cool racks with rack power density of about 20 to 35 kW per rack.

In an example, the chiller plant 102 may implement a vapor-compression refrigeration cycle. The vapor-compression refrigeration cycle refers to a compression process in order to raise the pressure of a coolant as it flows from an evaporator. In an example, the chiller plant may include a condenser which dissipates heat to a condenser loop disposed between the chiller plant 102 and a cooling tower (not shown) positioned outside the datacenter. Vaporized coolant is condensed within the cooling tower and the condensate is re-circulated via a pump through the condenser of the chiller plant 102. Thus, the chiller 102 may provide supply of coolant and a pump may circulate the coolant through other components of the hybrid cooling system 100. A coolant may refer to a fluid that is used to remove heat from an object. As an example, a coolant may refer to a liquid flowed through air-to-liquid or liquid-to-liquid heat exchangers to allow for transfer of heat from air or electronic components in the datacenter to the liquid. In an example, the coolant may comprise at least one of brine, a fluorocarbon liquid, a liquid metal, or other similar refrigerants used in cooling loops.

The ACU 104 is configured to be disposed in a data hall of the datacenter. A data hall refers to a secure, walled space within a data center that may contain server racks of various sizes or rack densities. The ACU 104 receives supply of the coolant from the chiller plant 102. The ACU may refer to an air-to-liquid heat exchanger system through which liquid coolant can circulate and may include, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchanger can vary without departing from the scope of the subject matter disclosed herein. The ACU 104 may include air moving devices which may blow cold air onto the racks 112. As shown by arrow 114, the ACU 104 may blow cold air through the racks 112. The electronic components in the racks 112 may reject heat to the cold air thereby heating the cold air which may be then exit the racks as exhaust air as shown by arrow 116. The exhaust air may be fed back to the ACU 104 where the exhaust air may reject heat to the cold coolant received by the ACU 104 from the chiller plant 102.

The coolant distribution line 106 comprises a first portion 106A, a second portion 106B, and a third portion 106C. The first portion 106A, second portion 106B, and third portion 106C are in series fluid communication. The ACU 104 receives supply of the coolant from the chiller plant 102 via the first portion 106A of the coolant distribution line 106. As used herein, two or more objects are in "series fluid communication" when a fluid can flow sequentially through each of the objects along a single flow path. For instance, two or more components of a hybrid cooling system are in "series fluid communication" when the components are connected with each other such that a liquid coolant can flow sequentially through each of the components along a single flow path. An object in series fluid communication with another object may receive fluid egressing from the other object as an input, either directly from the other object or indirectly with one or more other intervening objects between the object and the other object.

The CDU 108 may be coupled to an electronic component in the data hall. An electronic component refers to any heat generating discrete element in an electronic device, such as, for example, a computer system or other electronics unit requiring cooling. By way of example, an electronic component may comprise one or more integrated circuit dies and/or other electronic devices to be cooled, including one or more processor dies and memory dies. The CDU 108 may refer to a liquid-to-liquid heat exchanger system through which liquid coolant can circulate and may include, one or more discrete liquid-to-liquid heat exchangers coupled either in series or in parallel. A liquid-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchanger can vary without departing from the scope of the subject matter disclosed herein. The CDU 108 may include an integrated pump which may flow the cold coolant via a flexible hose or tubing along a flow path, as shown by arrow 118, through liquid-cooled cold plates attached to electronic components to be cooled. The liquid-cooled cold plates refer to a thermally conductive structure having a plurality of channels or passageways formed therein for flowing of liquid coolant therethrough. The electronic component on which the liquid-cooled cold plates are mounted may reject heat to the cold coolant. The coolant after absorbing heat from the electronic components is returned to the CDU 108 via a return flow path, as shown by arrow 120 in FIG. 1.

The ACU 104 and the CDU 108 are in series fluid communication via the second portion 106B of the coolant distribution line 106. The coolant egressing the ACU 104 passes through the second portion 106B to be fed back to the CDU 108. The heat exchanger 110 is in series fluid communication with the CDU 108 via the third portion 106C of the coolant distribution line 106. The coolant egressing the CDU 108 passes through the third portion to the heat exchanger 110. A heat exchanger refers to a device or system used to transfer heat from one medium to another. In an example, the heat exchanger may allow exchange of heat between a coolant and ambient air outside the facility that is cooled. In an example, the heat exchanger 110 may be a free cooling heat exchanger which allows free cooling of the coolant egressing the CDU 108 by using external ambient temperature to reject heat, rather than using a coolant compressor.

As may be understood, in the hybrid cooling system 100, the coolant is pumped through a single line, i.e., the coolant distribution line 106 which supplies the coolant to the ACU 104, CDU 108, and other components which are in series fluid communication. Unlike independent liquid-cooling and air-cooling systems, the coolant in the hybrid cooling system is not pumped through dedicated piping systems in parallel, and therefore, less power may be consumed by a pump pumping the coolant in the hybrid cooling system as compared to power consumed by pumps in independent liquid-cooling and air-cooling systems. Thus, the hybrid cooling system may be energy efficient as compared to independent air-cooling and liquid-cooling systems. Also, this arrangement may allow for a reduction in the number of pipes and their lengths inside the datacenter because a single coolant distribution line is used for both the ACU 104 and the CDU 108. Thus, the hybrid cooling system may be simpler to install and more cost effective to implement in a datacenter as compared to independent dedicated air-cooling and liquid-cooling systems.

Figure 2:
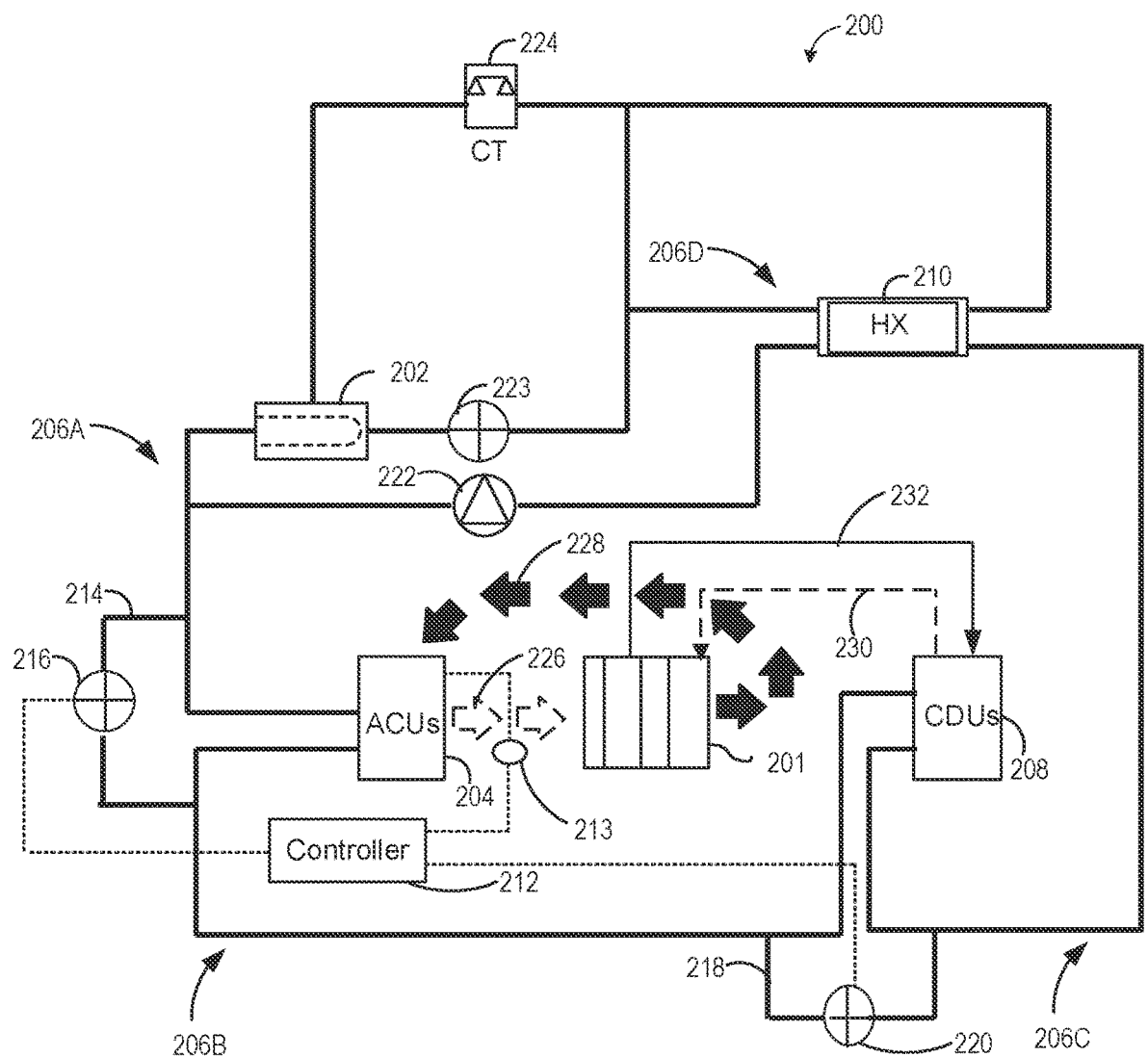
FIG. 2 illustrates a block diagram of a hybrid cooling system for a datacenter, according to another example of the present subject matter.

FIG. 2 illustrates a block diagram of a hybrid cooling system 200 for a datacenter according to another example of the present subject matter. The hybrid cooling system 200 is installed inside the data hall of the datacenter to cool a set of racks 201 housed in the datacenter. A rack refers to a housing, frame, compartment, holder, or any other holding arrangement that can house one or more heat generating components of a computer system or electronic system. In an example, the rack may comprise multiple electronic systems or sub systems, each having one or more heat generating components disposed therein requiring cooling. The rack may also provide an arrangement for mounting cooling structures or air vents on its front or rear doors to allow entry of cold air and exit of heated air from the rack.

The hybrid cooling system 200 comprises a chiller plant 202, a set of ACUs 204, a coolant distribution line 206, a set of CDUs 208, and a heat exchanger 210. The chiller plant 202, the coolant distribution line 206, and the heat exchanger 210 has similar components and functionalities as the chiller plant 102, the coolant distribution line 106, and the heat exchanger 110 shown in FIG. 1. The set of ACUs 204, also called ACUs 204, may include a collection of ACUs for supplying cold air to cool the racks 201. Each of the ACUs of the set may be similar to ACU 104 shown in FIG. 1. The number of ACUs in the set may be varied depending on the number of racks with low/medium rack power density in the datacenter. The set of CDUs 208, also called CDUs 208, may include a collection of CDUs for DLC of components on the racks 201. Each of the CDUs of the set may be similar to CDU 108 shown in FIG. 1. The number of CDUs in the set may be varied depending on the number of racks with high rack power density.

The coolant distribution line 206 includes a first portion 206A, a second portion 206B, and a third portion 206C similar to the first portion 106A, the second portion 106B, and the third portion 106C shown in FIG. 1. The hybrid cooling system 200 also includes a controller 212. The controller 212 may include a processing resource and memory storing instructions which when executed may perform actions to adjust one or more than one control valves to vary the flow of coolant through different portions of the coolant distribution line 206. In some examples, the controller 212 may also perform actions to adjust operations of different components, such as the ACUs 204 and CDUs 208 of the hybrid cooling system 200.

In an example, electronic components in a rack in the datacenter are cooled by air moving in parallel air flow paths through the rack. In an example, the controller 212 may be coupled to a temperature sensor 213 positioned at an outlet of the ACUs 204. Cool air may flow through the outlet of the ACUs 204 and may be blown over electronic components in the racks 201. In an example, air may be impelled by one or more air moving devices through the air flow-path either from front-to-back or back-to-front of the rack. In an example, an air moving device may be a fan or a blower. The ACUs 204 may include at least one air-moving device (not shown) facilitating airflow across the racks 201. The temperature sensor 213 may measure a temperature of airflow passing across the ACUs 204 on the electronic components in the rack 201. In an example, responsive to the temperature of the coolant supplied from the chiller plant 202 to the ACUs 204 being greater than the temperature of the airflow passing across the ACUs 204 onto the racks 201, the controller 212 may be configured to increase rotational speed of the at least one air moving device. By increasing the rotational speed of the air moving device, the rate of flow of air through the racks 201 may be increased thereby allowing greater dissipation heat from the racks 201. In another example, the controller may be configured to increase rotational speed of the at least one air moving device responsive to temperature of the airflow across the ACUs 204 onto the racks 201 being outside of a predefined air temperature range. In an example, the predefined air temperature range may be between 18 degree Celsius and 27 degree Celsius.

As explained earlier, the set of ACUs 204 may include multiple ACUs connected in series or parallel. Each of the ACUs may be mounted on a rear door of each of the set of racks 201. Say, if there are ten racks, there may be 10 ACUs with each ACU mounted on a rear door of a rack. With change in number of racks of low/medium rack power density, the number of ACUs in the hybrid cooling system 200 may need to be altered. Suppose, 2 racks of medium/low rack power density are added to the datacenter. With the increase in the number racks of medium/low rack power density in the datacenter, in this case, two additional ACUs may be added along with the existing set of ACUs. Since, the ACUs are modular, installation of additional ACUs may be a comparatively simple process. However, each of the additional ACUs are to be provided with a supply of coolant. Supplying coolant to the two additional ACUs may require a change in distribution of flow of coolant between the ACUs 204 and the CDUs 208.

As shown in FIG. 2, the hybrid cooling system 200 includes an ACU bypass line 214 connecting the first portion 206A of the coolant distribution line to the second portion 206B of the coolant distribution line bypassing the ACUs 204. A bypass line refers to a piping system or a portion thereof that may allow flow of coolant through itself while bypassing the flow from a component of the hybrid cooling system 200. Thus, the ACU bypass line 214 allows flow of the coolant through itself while bypassing the flow of the coolant through the ACUs 204. The ACU bypass line 214 may allow to change the distribution of flow of coolant between the ACUs 204 and the CDUs 208.

As shown in FIG. 2, the hybrid cooling system 200 includes an ACU bypass valve 216 coupled to the ACU bypass line 214 to control the flow of the coolant from the first portion 206A to the second portion 206B via the ACU bypass line 214. The ACU bypass valve 216 may be a control valve which is a device which regulates or maintains the required pressure in a process control loop, such as portions of the coolant distribution line 206 in this case. The controller 212 may be coupled to the ACU bypass valve 216 to adjust the ACU bypass valve 216 between a liquid-cooled mode and an air-cooled mode based on cooling load in the datacenter. The liquid-cooled mode of the ACU bypass valve 216 corresponds to a fully open position of the ACU bypass valve 216 such that coolant flowing through the first portion 206A of the coolant distribution line flows via the ACU bypass line 214 through the second portion 206B of the coolant distribution line 206 to the CDU 208. The air-cooled mode of the ACU bypass valve 216 corresponds to a fully closed position of the ACU bypass valve 216 such that a negligible amount of coolant flows through the ACU bypass line 214 between the first portion 206A and the second portion 206B. The cooling load refers to the rate at which heat shall be removed from the datacenter to maintain a constant air temperature. In an example, change in cooling load may result due to a change in number of racks or types of computing systems in the racks in the datacenter.

A flow of the coolant in the ACU bypass line 214 between the first portion 206A and the second portion 206B increases when the ACU bypass valve 216 is adjusted from the air-cooled mode to the liquid-cooled mode. With changes in number of racks of low/medium rack power density or racks with high rack power density, number of ACUs 204 or CDUs 208 may be altered. With alterations in number of ACUs 204 or CDUs 208, the controller 212 may adjust the ACU bypass valve 216 between the air-cooled mode and the liquid-cooled mode allowing for dynamic changes in the distribution of flow of coolant between the ACUs 204 and the CDUs 208.

The hybrid cooling system 200 further includes a CDU bypass line 218 connecting the second portion 206B of the coolant distribution line to the third portion 206C of the coolant distribution line bypassing the CDUs 208. As shown in FIG. 2 a control valve 220 is coupled to the CDU bypass line 218 to control the flow of the coolant from the second portion 206B to the third portion 206C via the CDU bypass line 218. The control valve 220 is also referred to as the CDU bypass valve 220. The controller 212 is coupled to the CDU bypass valve 220 to adjust the CDU bypass valve 220 between the air-cooled mode and the liquid-cooled mode based on cooling load in the datacenter. The liquid-cooled mode of the CDU bypass valve 220 corresponds to a fully closed position of the CDU bypass valve 220 such that coolant flowing through the second portion 206B of the coolant distribution line does not bypass the CDUs 208. The air-cooled mode of the CDU bypass valve 220 corresponds to a fully open position of the CDU bypass valve 216 such that coolant flowing through the second portion 206B of the coolant distribution line bypasses the CDUs 208.

Flow of coolant in the CDU bypass line 218 between the second portion 206B and the third portion 206C decreases when the CDU bypass valve 220 is adjusted from the air-cooled mode to the liquid-cooled mode. With changes in number of racks of low/medium rack power density or rack with high rack power density, number of ACUs 204 or CDUs 208 may be altered. With changes in number of ACUs 204 or CDUs 208, the controller 212 may adjust the CDU bypass valve 220 between the air-cooled mode and the liquid-cooled mode allowing for dynamic changes in the distribution of flow of coolant between the ACUs 204 and the CDUs 208. Thus, the hybrid cooling system 200 may provide flexibility of air and liquid cooling capacity adjustment within the data center without substantial changes to mechanical and electrical systems in the datacenter.

An example of changing the distribution of flow of coolant to the ACUs 204 and the CDUs 208 is shown using table 1 below.

TABLE 1

| Number of ACUs | Number of CDUs | Rack power density | |
|---|---|---|---|
| | | High | Medium |
| 6 | 10 | 10 | 15 |
| 6 | 12 | 15 | 15 |
| 6 | 18 | 22 | 15 |

As shown in table 1, consider that at the time of installation, the datacenter has 15 racks of medium rack power density and 10 racks of high rack power density. Generally, racks with high rack power density may be effectively cooled using liquid-cooling, whereas, racks of medium rack power density may be cooled using air-cooling. In this scenario, there may be 6 ACUs for air-cooling and 10 CDUs for liquid-cooling to maintain constant DBT inside the datacenter. If the number of racks with high rack power density are increased from 10 to 15, more CDUs may be needed for liquid-cooling. If the number of racks with high rack power density are further increased from 15 to 22, the number of CDUs may be increased to 18. Due to these changes in the number of CDUs in the hybrid cooling system 200, the flow of coolant to the CDUs may required to be increased.

Once the number of CDUs 208 are increased, the administrator may provide an input to the controller 212. The input may indicate that the hybrid cooling system 200 now has 18 CDUs and 6 ACUs. In response to identifying the increase in the number of CDUs, the controller 212 may adjust the ACU bypass valve 216 to move towards the liquid-cooled mode away from the air-cooled mode. When the ACU bypass valve 216 is adjusted to move towards the liquid-cooled mode, a flow of the coolant in the ACU bypass line 214 between the first portion 206A and the second portion 206B may increase. Thus, more coolant is flowed through the ACU bypass line 214 via the second portion 206B of the coolant distribution line to the CDU 208 such that all the CDUs 208 may receive supply of coolant thereby increasing the liquid-cooling capacity of the hybrid cooling system 200.

In addition, the controller 212 may also adjust the CDU bypass valve 220 to move towards the liquid-cooled mode away from the air-cooled mode. When the CDU bypass valve 220 is adjusted to move towards the liquid-cooled mode, a flow of the coolant in the CDU bypass line 218 between the second portion 206B and the third portion 206C decreases consequently allowing more coolant to be flowed into the CDU to meet its increased coolant demand.

Another example of changing the distribution of flow of coolant to the ACUs 204 and the CDUs 208 is shown using table 2 below.

TABLE 2

| Number of ACUs | No. of CDUs | Rack power density | |
|---|---|---|---|
| | | High | Medium |
| 6 | 8 | 10 | 15 |
| 15 | 8 | 10 | 20 |
| 20 | 8 | 10 | 22 |

As shown in table 2 above, the number of racks of medium rack power density in the data center are gradually increased from 15 to 22. This results in an increased demand for air-cooling and thus the number of ACUs are gradually increased from 6 to 20 to maintain constant DBT inside the datacenter. The number of CDUs remain constant. Due to these changes in the number of ACUs in the hybrid cooling system 200, the flow of coolant to the ACUs 204 may required to be increased.

Once the number of ACUs 204 are increased, the administrator may provide an input to the controller 212. The input may indicate that the hybrid cooling system 200 now has 20 ACUs and 8 CDUs. In response to identifying the increase in the number of ACUs, the controller 212 may adjust the ACU bypass valve 216 to move towards its air-cooled mode away from its liquid-cooled mode. When the ACU bypass valve 216 is adjusted to move towards its air-cooled mode, a flow of the coolant in the ACU bypass line 214 between the first portion 206A and the second portion 206B decreases. Thus, more coolant may be flowed through the ACUs 204 such that the ACUs 204 now receive an increased supply of coolant.

The hybrid cooling system 200 further comprises at least one coolant pump 222 coupled in fluid communication with the coolant distribution line 206 to pump coolant through the first portion 206A, second portion 206B, and third portion 206C of the coolant distribution line 206. In an example, the controller 212 is configured to adjust the coolant pump 222 based on a difference between a coolant pressure in the first portion 206A and a coolant pressure in the second portion 206B of the coolant distribution line 206.

In an example, temperature of the data hall may be monitored. In response to the temperature of the data hall being outside of a predefined temperature range, the controller 212 is configured to change operating speed of the coolant pump 222 to a maximum operating speed. By increasing the speed of the coolant pump 222, flow rate of the coolant through the ACUs 204 or the CDUs 208 may be increased, thus controlling the temperature of the data hall. In an example, if the coolant pump 222 is already at the maximum operating speed, the controller 212 is configured to adjust the ACU bypass valve 216 to move to its liquid-cooling mode to increase flow rate of coolant to the CDUs 208. Thus, flow rate of coolant to the CDUs 208 may be increased consequently removing more heat from the racks by DLC thereby bringing back the temperature of the data hall within the predefined temperature range.

The coolant distribution line 206 further comprises a fourth portion 206D. The fourth portion 206D connects the heat exchanger 210 with the chiller plant 202. The coolant egressing from the heat exchanger 210 may pass through the fourth portion to the chiller plant 202. As shown in FIG. 2 a head pressure control valve (HPCV) 223 may be coupled to the fourth portion 206D to control the flow of the coolant from the heat exchanger 210 to the chiller plant 202 via the fourth portion 206D. In an example, the heat exchanger 210 is a free cooling heat exchanger. The heat exchanger 210 may be connected to a cooling tower 224. In an example, the cooling tower 224 is outside the datacenter. The cooling tower 224 may provide free cooling. Free cooling refers to a technique of using low external air temperatures to assist in chilling a coolant, rather than using a refrigeration process. Since no compressor work is involved in chilling, the technique is called "free" cooling. In an example, if the temperature of the coolant is outside a predefined temperature range due to lack of free cooling at the cooling tower 224, the controller 212 is configured to adjust the HPCV 223 to a maximum open position to increase flow of coolant to the chiller plant 202 from the heat exchanger 210.

During operation, the chiller 202 may provide supply coolant through the first portion 206A of the coolant distribution line to the ACUs 204. In an example, temperature of the supply coolant to the ACUs 204 may be 20° C. The ACUs 204 may blow cool supply air onto the racks 201. In an example, temperature of the supply air blown onto the racks 201, as shown by arrows 226 in FIG. 2, may range between 18° C.-27° C. In an example, the cool supply air may be blown from the rear end of the racks 201 towards the front end and hot return air may flow back into the ACUs 204 via a return air flow path, as shown by the arrows 228. The hot return air may reject heat to the supply coolant in the ACU 204 and raise the temperature of a return coolant exiting from the ACUs 204. In an example, the temperature of the return air may range between 30° C. to 35° C. and the return coolant temperature may be 28° C.

Since, the ACUs 204 and the CDUs 208 are in series fluid communication via the second portion 206B of the coolant distribution line, the return coolant egressing the ACUs 204 pass through the second portion 206B to be fed back to the CDUs 208. Generally, temperature on the chips cooled by DLC may be in the range of 32° C. to 35° C. Thus, temperature of the coolant flowed by the CDUs 208 to electronic components on the racks 201 (more particularly, to liquid-cooled cold plates thereof) may be kept at 30° C. In our example, the temperature of the coolant flowed by the CDUs 208 to the liquid-cooled cold plates, as shown by arrows 230 in FIG. 2, may be 28° C. which is the return coolant temperature from the ACUs 204. The electronic components may reject heat to the coolant flowed through the liquid-cooled cold plates and thereby the temperature of the coolant may rise. The coolant exiting from the CDUs 208 is shown by arrows 232. In an example, the temperature of the coolant exiting from the CDUs 208 may be 38° C.

After the CDUs 208, the coolant may be flowed to heat exchanger 210 which is connected to the cooling tower 224. In an example, the cooling tower 224 may provide free cooling. Since the temperature of the coolant exiting from the CDUs 208 may be higher than the ambient air temperature at most of locations on earth, the heat exchanger 210 may be able to provide free cooling round the year. In case of high ambient air temperature in a datacenter location and low temperature of the coolant exiting the CDUs 208, the coolant may be passed to the chiller 202 via the fourth portion 206D of the coolant distribution line. When the cooling tower 224 and the heat exchanger 210 is able to provide free cooling, the flow of the coolant may bypass the chiller 202 and flow through the first portion 206A of the coolant distribution line into the ACUs 204.

If free cooling is inadequate at the cooling tower 224 and the heat exchanger 210 and the temperature of the coolant is outside a predefined temperature range due to lack of free cooling, the controller 212 is configured to adjust the HPCV 223 to a fully open position to increase flow of coolant to the chiller plant 202 from the heat exchanger 210. The coolant from the cooling tower 224 may also be flowed to the chiller 202. The HPCV 223 may modulate the coolant flow to maintain the proper differential pressure across the chiller so that the chiller functions properly. Also, as explained earlier, in case the air-cooling capacity or the liquid-cooling capacity needs to be adjusted, the ACU bypass valve 216 and the CDU bypass valve 220 may be adjusted to control the bypass flows based on the cooling load.

Figure 3:
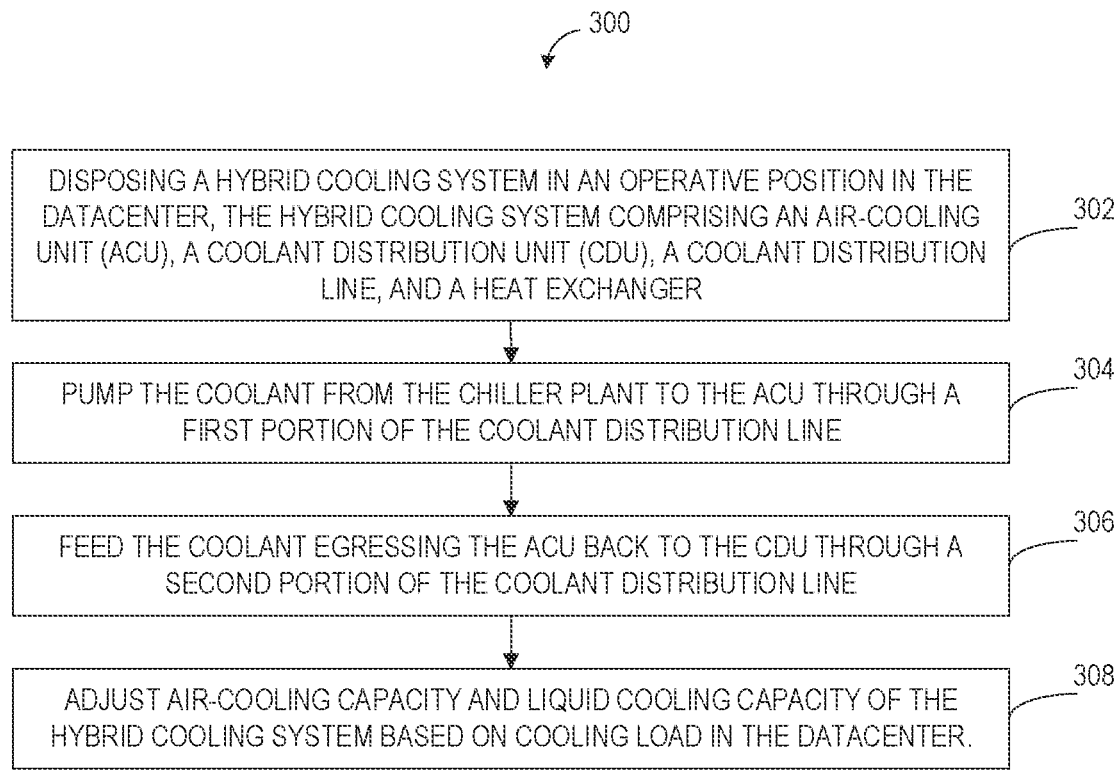
FIG. 3 is a flowchart of a method for cooling a datacenter, according to an example of the present subject matter.

FIG. 3 illustrates a flowchart of a method 300 of cooling a datacenter, according to an example. In an example, the method 300 may be performed by a hybrid cooling system, such as the hybrid cooling system 100 of FIG. 1. Terminology used herein is consistent with earlier description. Components described are examples of components described in earlier figures.

At block 302, the method 300 includes disposing a hybrid cooling system in an operative position in the datacenter. The hybrid cooling system comprising an ACU, a CDU, a coolant distribution line, and a heat exchanger. The ACU receives supply of coolant from a chiller plant via a first portion of the coolant distribution line. The ACU and CDU are in series fluid communication via a second portion of the coolant distribution line. The CDU and the heat exchanger are in series fluid communication via a third portion of the coolant distribution line.

At block 304, the method 300 includes pumping the coolant from the chiller plant to the ACU through the first portion of the coolant distribution line. In an example, a coolant pump coupled in fluid communication with the coolant distribution line may pump coolant through the first portion, second portion, and third portion of the coolant distribution line. In an example, the controller is configured to adjust the coolant pump based on a difference between a coolant pressure in the first portion and a coolant pressure in the second portion of the coolant distribution line.

At block 306, the method 300 includes feeding the coolant egressing the ACU back to the CDU through the second portion of the coolant distribution line. In an example, the ACU and the CDU are in series fluid communication via the first portion of the coolant distribution line. Thus, the coolant exiting the ACU may be fed through the inlet of the CDU via the first portion of the coolant distribution line.

At block 308, the method 300 includes adjusting the flow of coolant to at least one of the ACU or CDU based on cooling load in the datacenter. In an example, the coolant flowing through the ACU and CDU may be controlled using an ACU bypass valve of the hybrid cooling system. The ACU bypass valve may be coupled to an ACU bypass line connecting the first portion of the coolant distribution line to the second portion of the coolant distribution line bypassing the ACU. When demand for liquid-cooling of the hybrid cooling system increases, a number of CDUs in the liquid cooling system may also be increased to maintain the temperature of the datacenter with a specific range. With increase in number of CDUs, demand for coolant supplied to the CDU may also increase. In an example, the ACU bypass valve may be adjusted from the air-cooling mode to the liquid-cooling mode to increase the flow of the coolant in the first bypass line between the first portion and the second portion of the coolant distribution line. Thus, the coolant flow to the CDUs may be increased.

In another example, the coolant flowing through the CDU may be controlled using a CDU bypass valve of the hybrid cooling system. The CDU bypass valve is coupled to a CDU bypass line connecting the second portion of the coolant distribution line to the third portion of the coolant distribution line bypassing the CDU. When demand for liquid-cooling of the hybrid cooling system increases, a number of CDUs in the liquid cooling system may also be increased to maintain the temperature of the datacenter with a specific range. With increase in number of CDUs, demand for coolant supplied to the CDU may also increase. In an example, the CDU bypass valve may be adjusted from the air-cooling mode to the liquid-cooling mode to decrease the flow of the coolant in the second bypass line between the second portion and the third portion of the coolant distribution line. Thus, the coolant flow bypassing the CDUs may be decreased and more coolant may be directed into the CDUs.

Figure 4:
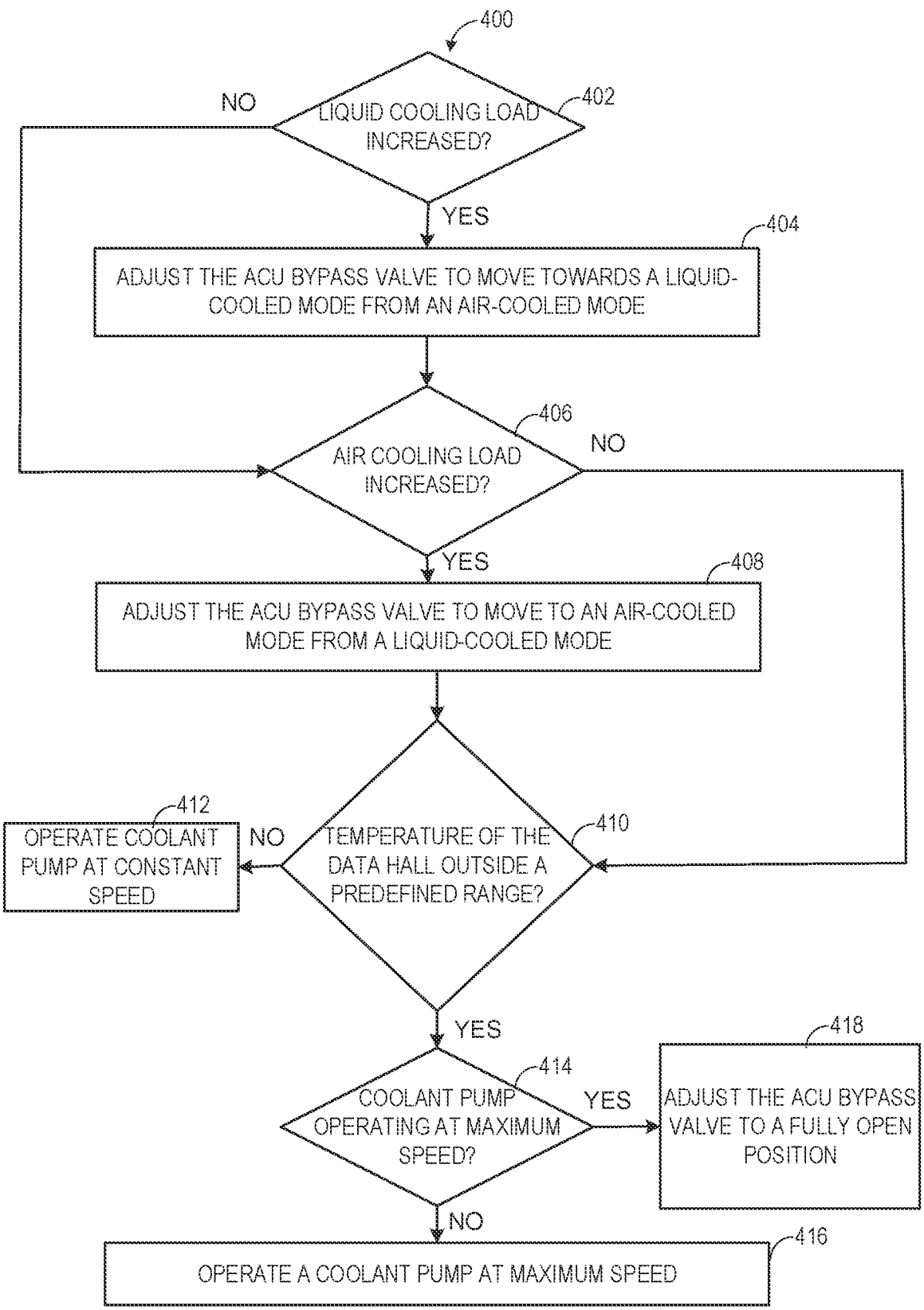
FIG. 4 is a flowchart of a method for adjusting flow of coolant in the hybrid cooling system, according to an example of the present subject matter.

FIG. 4 illustrate a flowchart of a method 400 for adjusting flow of coolant between the ACUs and CDUs of the hybrid cooling system, according to another example. In an example, the method 400 may be performed by a hybrid cooling system, such as the hybrid cooling system 100 of FIG. 1. Terminology used herein is consistent with earlier description. Components described are examples of components described in earlier figures.

At block 402, the method 400 begins with the hybrid cooling system checking whether the demand for liquid-cooling has increased. This may be checked based on an input from a user or operator. In an example, the input may indicate a number of CDUs or ACUs currently present in the hybrid cooling system. In response to determining that the demand for liquid-cooling has increased ("Yes" branch from block 402), the hybrid cooling system may adjust an ACU bypass valve to move from an air-cooled mode towards a liquid-cooled mode, at block 404. When the ACU bypass valve is adjusted to move towards the liquid-cooled mode, the flow of coolant in the ACU bypass line between the first portion of the coolant distribution line and the second portion of the coolant distribution line increases consequently increasing the coolant flow to the CDUs.

At block 406, in response to determining that the demand for liquid-cooling has not increased ("No" branch from block 402), the hybrid cooling system may check whether the demand for air-cooling has increased. This may be checked based on receiving an input from a user or operator. In an example, the input may indicate a number of CDUs or ACUs currently present in the hybrid cooling system. In response determining that the demand for air-cooling of the hybrid cooling system has increased ("Yes" branch from block 406), a CDU bypass valve may be adjusted to move from the liquid-cooled mode towards the air-cooled mode, at block 408. When the ACU bypass valve is adjusted to move towards the air-cooled mode, the flow of coolant in the ACU bypass line between the first portion of the coolant distribution line and the second portion of the coolant distribution line decreases consequently increasing the coolant flow to the ACUs.

In response to determining that the demand for air-cooling has not increased ("No" branch from block 406), the hybrid cooling system may check whether the temperature of the data hall is outside a predefined range, at block 410. In an example, the predefined range may be between 18-27 degree Celsius. In response to determining that the temperature of the data hall is within the predefined range ("No" branch from block 410), the hybrid cooling system may operate the coolant pump at a constant speed, at block 412. In response to determining that the temperature of the data hall is outside the predefined range ("Yes" branch from block 410), the hybrid cooling system may check whether the coolant pump is operating at its maximum speed, at block 414.

In response to determining that the coolant pump is not operating at its maximum speed ("No" branch from block 414), the hybrid cooling system may increase the speed of the coolant pump to the maximum, at block 416. In response to determining that the coolant pump is operating at its maximum speed ("Yes" branch from block 414), the hybrid cooling system, at block 418, may adjust the ACU bypass valve to move towards its liquid-cooled mode thereby increasing the flow of coolant to the CDUs to assist in heat removal from the datacenter through liquid-cooling.

While certain implementations have been shown and described above, various changes in form and details may be made. For example, some features, functions, and/or formulas/equations that have been described in relation to one implementation and/or process can be related to other implementations. In other words, processes, features, components, and/or properties described in relation to one implementation can be useful in other implementations. Furthermore, it should be appreciated that the systems and methods described herein can include various combinations and/or sub-combinations of the components and/or features of the different implementations described.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

The invention claimed is:

1. A hybrid cooling system for a datacenter, comprising:
   a chiller plant to provide supply of coolant;
   an air-cooling unit (ACU) configured to be disposed in a data hall of the datacenter;
   a coolant distribution line comprising a first portion, a second portion, and a third portion, wherein the first, second, and third portions are in series fluid communication and the ACU receives supply of the coolant from the chiller plant via the first portion;
   a coolant distribution unit (CDU) coupled to an electronic component in the data hall, wherein the ACU and the CDU are in series fluid communication via the second portion of the coolant distribution line and the coolant egressing the ACU passes through the second portion to be fed to the CDU; and
   a heat exchanger in series fluid communication with the CDU via the third portion of the coolant distribution line, wherein the coolant egressing the CDU passes through the third portion to the heat exchanger.

2. The hybrid cooling system of claim 1, further comprising:
   an ACU bypass line connecting the first portion to the second portion bypassing the ACU; and
   an ACU bypass valve coupled to the ACU bypass line to control the flow of the coolant from the first portion to the second portion via the ACU bypass line.

3. The hybrid cooling system of claim 2, further comprising a controller coupled to the ACU bypass valve to adjust the ACU bypass valve between a liquid-cooled mode and an air-cooled mode based on cooling load in the datacenter, wherein a flow of the coolant in the ACU bypass line between the first portion and the second portion increases when the ACU bypass valve is adjusted from the air-cooling mode to the liquid-cooling mode.

4. The hybrid cooling system of claim 3, further comprising:
   a CDU bypass line connecting the second portion to the third portion bypassing the CDU; and
   a CDU bypass valve coupled to the CDU bypass line to control the flow of the coolant from the second portion to the third portion via the CDU bypass line.

5. The hybrid cooling system of claim 4, wherein the controller is coupled to the CDU bypass valve to regulate the CDU bypass valve between the liquid-cooled mode and the air-cooled mode based on cooling load in the datacenter, wherein a flow of coolant in the CDU bypass line between the second portion and the third portion decreases when the CDU bypass valve is adjusted from the air-cooled mode to the liquid-cooled mode.

6. The hybrid cooling system of claim 3, further comprising at least one coolant pump coupled in fluid communication with the coolant distribution line to pump coolant through the first, second, and third portions of the coolant distribution line, and wherein the controller is configured to adjust the at least one coolant pump based on a difference between a coolant pressure in the first portion and a coolant pressure in the second portion.

7. The hybrid cooling system of claim 6, wherein responsive to a sensed temperature of the data hall being outside of a predefined temperature range, the controller is configured to change operating speed of the at least one coolant pump to a maximum operating speed, and responsive to the at least one coolant pump already being at the maximum operating speed, the controller is configured to adjust the ACU bypass valve to a fully open position to increase flow of coolant to the CDU.

8. The hybrid cooling system of claim 3, wherein the coolant distribution line further comprises:
a fourth portion connecting the heat exchanger with the chiller plant, wherein the coolant egressing from the heat exchanger passes through the fourth portion to the chiller plant; and
a head pressure control valve coupled to the fourth portion to control the flow of the coolant from the heat exchanger to the chiller plant via the fourth portion.

9. The hybrid cooling system of claim 8, responsive to determining that the temperature of the coolant is outside a predefined temperature range due to lack of free cooling at the heat exchanger, the controller is configured to adjust the head pressure control valve to a maximum open position to increase flow of coolant in the fourth portion between the chiller plant and the heat exchanger.

10. The hybrid cooling system of claim 1, wherein the heat exchanger is a free cooling heat exchanger.

11. The hybrid cooling system of claim 3, further comprising at least one air-moving device facilitating airflow across the ACU, and wherein the controller is configured to increase rotational speed of the at least one air moving device responsive to the temperature of the coolant supplied from the chiller plant to the ACU being greater than the temperature of the airflow passing across the ACU.

12. The hybrid cooling system of claim 3, further comprising at least one air-moving device facilitating airflow across the ACU, and wherein the controller is configured to increase rotational speed of the at least one air moving device responsive to temperature of the airflow across the ACU being outside of a predefined air temperature range.

13. A hybrid cooling system for a datacenter, comprising:
an air-cooling unit (ACU) configured to be disposed in a data hall of the datacenter;
a coolant distribution line comprising a first portion, a second portion, and a third portion, wherein the first, second, and third portions are in series fluid communication and the ACU receives supply of a coolant via the first portion;
a coolant distribution unit (CDU) coupled to an electronic component in the data hall, wherein the ACU and the CDU are in series fluid communication via the second portion of the coolant distribution line and the coolant egressing the ACU passes through the second portion to be fed back to the CDU;
an ACU bypass line connecting the first portion to the second portion bypassing the ACU; and an ACU bypass valve coupled to the ACU bypass line to control the flow of the coolant from the first portion to the second portion via the ACU bypass line, wherein a flow of the coolant in the ACU bypass line between the first portion and the second portion increases when the ACU bypass valve is adjusted from an air-cooled mode to a liquid-cooled mode.

14. The hybrid cooling system of claim 13, further comprising a controller coupled to the ACU bypass valve to adjust the ACU bypass valve between air-cooled mode and the liquid-cooled mode.

15. The hybrid cooling system of claim 13, further comprising:
a chiller plant to provide supply of the coolant to the ACU; and
a heat exchanger in series fluid communication with the CDU via the third portion of the coolant distribution line, wherein the coolant egressing the CDU passes through the third portion to the heat exchanger.

16. A method of cooling a datacenter, comprising:
disposing a hybrid cooling system in an operative position in the datacenter, the hybrid cooling system comprising an air-cooling unit (ACU), a coolant distribution unit (CDU), a coolant distribution line, and a heat exchanger, wherein the ACU receives supply of coolant from a chiller plant via a first portion of the coolant distribution line, the ACU and CDU are in series fluid communication via a second portion of the coolant distribution line, and the CDU and the heat exchanger are in series fluid communication via a third portion of the coolant distribution line;
operating the hybrid cooling system to cool the datacenter, the operating comprising:
pumping the coolant from the chiller plant to the ACU through the first portion of the coolant distribution line;
feeding the coolant egressing the ACU back to the CDU through the second portion of the coolant distribution line; and
adjusting flow of coolant to at least one of the ACU or the CDU based on cooling load in the datacenter.

17. The method of claim 16, wherein the operating further comprises providing the coolant egressing the CDU to the heat exchanger via the third portion of the coolant distribution line.

18. The method of claim 16, wherein the adjusting comprises:
controlling the coolant flowing through the ACU and CDU using an ACU bypass valve of the hybrid cooling system, wherein the ACU bypass valve is coupled to a an ACU bypass line connecting the first portion to the second portion bypassing the ACU; and
controlling the coolant flowing through the CDU using a CDU bypass valve of the hybrid cooling system, wherein the CDU bypass valve is coupled to a CDU bypass line connecting the second portion to the third portion bypassing the CDU.

19. The method of claim 18, wherein the adjusting comprises:
adjusting the ACU bypass valve between a liquid-cooled mode and an air-cooled mode based on the cooling load in the datacenter; and
adjusting the ACU bypass valve from the air-cooled mode to the liquid-cooled mode such that a flow of the coolant in the ACU bypass line between the first portion and the second portion increases.

20. The method of claim 18, wherein the adjusting further comprises:
  adjusting the CDU bypass valve between a liquid-cooled mode and an air-cooled mode based on the cooling load in the datacenter; and
  adjusting the CDU bypass valve from the air-cooled mode to the liquid-cooled mode such that a flow of the coolant in the CDU bypass line between the second portion and the third portion decreases.

\* \* \* \* \*